May 15, 1962 A. C. SHECKLER 3,035,109

THERMOELECTRIC PANEL

Filed April 9, 1959

*INVENTOR.*
ADDISON C. SHECKLER

*BY* Herman Seid

*ATTORNEY*

United States Patent Office 3,035,109

Patented May 15, 1962

3,035,109

THERMOELECTRIC PANEL

Addison C. Sheckler, Cato, N.Y., assignor to Carrier Corporation, Syracuse, N.Y., a corporation of Delaware Filed Apr. 9, 1959, Ser. No. 805,216
1 Claim. (Cl. 136—4)

This invention relates to refrigeration, more particularly, to a battery of thermoelectric elements adapted to provide heating or cooling arranged to form a panel having structural strength and rigidity and possessing thermal insulating characteristics.

The use of thermoelectric couples to implement the transfer of heat by employing the heat pumping effects of the Peltier phenomenon has long been known. However, the attainment of commercially feasible structures formed of these thermoelectric couples has presented a variety of difficulties. This has been due to the fact that the mechanical problems involved in arranging a requisite number of couples into a battery sufficient to provide practical heat pumping requirements have not successfully been overcome. In order to minimize Joule Heat losses, due to electrical resistance of the arm, it is desirable to make the current path between junctions as small as possible. Additionally, the smaller the arm, the more compact the refrigeration system. Accordingly, the conventional arm of a thermoelectric couple is formed with an interface dimension of the order of one quarter of an inch. Thus, when it is considered that one face of the arm is adjacent the cold junction and the other face adjacent the hot junction; and that it is necessary to insulate these junctions from each other both thermally and electrically, the magnitude of the problem becomes apparent. Any structure provided for orienting and insulating the thermoelectric arms employed, must be simple in fabrication and maintenance in order to attain a commercially economical apparatus, must have desired structural strength and must provide for effective heat transfer from the junctions to a desired surface with minimum losses.

It is with the above problems in mind that the present means have been evolved, means implementing the orientation of thermoelectric elements so that they may be coupled together into a battery or pile of hermoelectric coupled together into a battery or pile of thermoelectric couples being thermally and electrically insulated from the cold junctions, in a compact structurally strong panel with the thermoelectric elements providing structural strength.

It is accordingly a primary object of this invention to provide improved means for conjoining a plurality of thermoelectric couples into a battery.

Another object of the invention is to provide an improved panel serving to implement the pumping of heat between opposite sides of said panel.

A further object of the invention is to provide an improved means for insulating the hot junctions from the cold junctions of a battery of thermoelectric couples.

An additional object of the invention is to provide a lightweight, compact, structurally strong thermal insulating panel.

These and other objects of the invention which will become apparent from the following specification and claims are achieved by forming a panel member in the shape of an envelope comprising two spaced sheetlike walls of metal or the like. Between these walls, the thermoelectric arms employed are sandwiched with the hot junction arranged in heat transfer relationship with one of said walls, and the cold junction arranged in heat transfer relationship with the other of said walls. The interior surface of the walls is electrically insulated from the aforementioned junctions by means of an electrical insulating material having good thermal conductivity. After assembly the envelope is evacuated whereby the opposite walls of the envelope are substantially thermally insulated from each other. Additionally, the evacuation of the interior of the envelope forming the panel results in an external pressure on the walls of the envelope which serves to maintain the components of the panel in assembled and good heat transfer relationship.

An important feature of the invention resides in the fact that by means of a relatively simple and inexpensive structure, the thermoelectric arms employed in forming the couples of the battery may be supported in an operative position with the hot junctions thermally and electrically insulated from the cold junction and with the arms acting to provide structural strength to the panel. This is accomplished by virtue of the fact that the vacuum between the walls of the envelope are electrically insulated from the hot and cold junctions of the battery, the vacuum serving to maintain the panel walls against the arms.

Another feature of the invention resides in the fact that the path between the hot and cold walls of the panel is relatively long as compared to the path between either the hot or cold wall and its respective junctions, whereby heat transfer between the junctions and their respective walls will be relatively efficient as compared to any heat transfer between one wall and the other.

The specific structural details of the invention, and their mode of fabrication and operation will be made most manifest, and particularly pointed out in full, clear, concise, and exact terms in conjunction with the accompanying drawings wherein.

Referring now more particularly to the drawings, like numerals in the figures will be employed to designate like parts.

Figure 1:
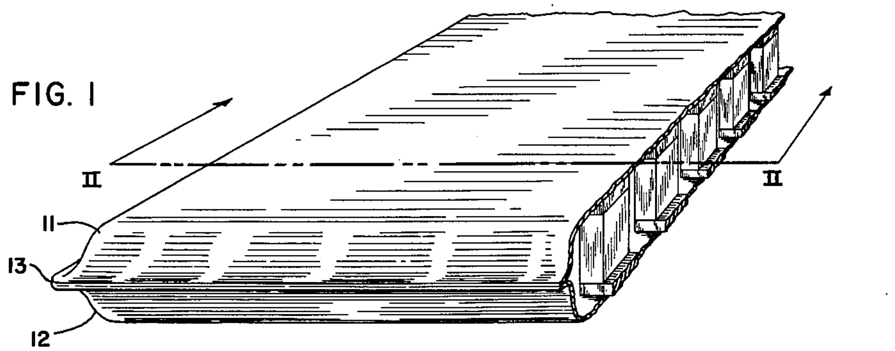
FIGURE 1 represents a perspective partial view of a panel constructed in accordance with the teachings of this invention.
Figure 2:
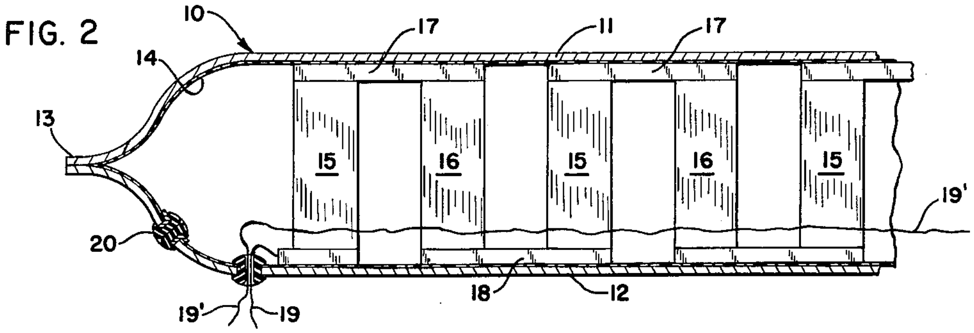
FIGURE 2 is a cross sectional view taken on line II—II of FIGURE 1 illustrating schematically the structural interrelationship of the thermoelectric components, the thermal insulation and the panel.
Figure 3:
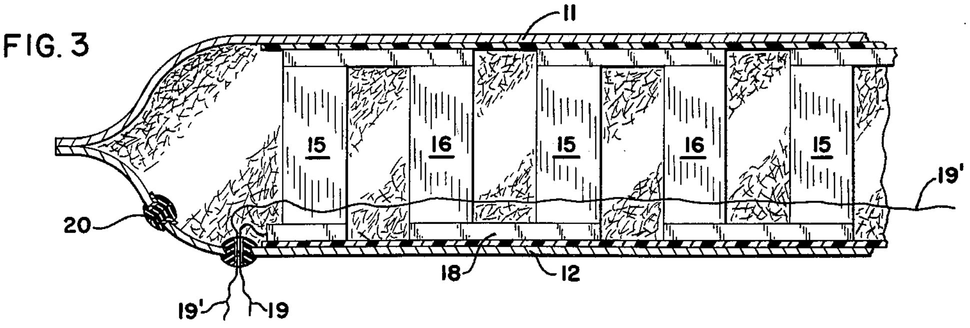
FIGURE 3 is a cross sectional view similar to FIGURE 2 illustrating use of a multiple layered reflective insulation.

As best seen in the drawings, the panel 10 is formed with an upper wall 11 spaced from a lower wall 12, with the edges of said wall meeting at seam 13 formed about the periphery thereof. In a preferred embodiment of the invention, the walls 11 and 12 of the panel 10 are formed of sheets of copper nickel, stainless steel, or aluminum, or the like sheet materials having a high thermal conductivity. The interior surface of the envelope formed by walls 11 and 12 is electrically insulated by means of insulation 14. This is most effectively accomplished by coating the interior surface of the wall with an electrical insulating material such as flake mica embedded in a partially polymerized epoxy resin where copper nickel is employed for the walls; or glass enamel where aluminum is employed. It will be apparent to those skilled in the art that separate insulating materials may be employed in lieu of the aforementioned coatings such as illustrated in FIGURE 3, there is shown a modified structure in which a multiple layered reflective such as a non-conductive plastic film of polyesters including polyethylene terephthalate is employed. Within the envelope formed between walls 11 and 12, a plurality of thermoelectric elements 15 and 16 are arranged to form couples. The ends of each element 15 and 16 respectively are electrically connected by means of junction 17 at one end, and 18 at the other end. Elements 15 and 16 thus are seen to form arms of a couple forming a thermoelectric heat pump. It will be obvious that a spacing is provided between each arm 15 and 16.

In fabricating the above described structure, two sheets of appropriate material are cut to desired size, one side of the material is insulated either by coating or the provision of a layer of insulation 14, and the thermoelectric couples are positioned on the insulated surface of one of said sheets. The other of said sheets is then superposed over the first mentioned sheet upon which the thermoelectric couples have been arranged, and the edges of the sheets joined together in any suitable fashion to provide an airtight joint. Electrical leads 19, 19' are led through the panel wall in an appropriate insulated fashion and the interior of the envelope formed between walls 11 and 12 is evacuated through aperture 20 preferably to provide a .01 micron vacuum, after which the aperture 20 is appropriately sealed.

Though electrical leads 19, 19' have both been illustrated as coming through a single aperture in the wall, it will be apparent to those skilled in the art that the circuit through the couples forming the battery may be completed through either of walls 11 or 12; or by extending lead 19 through another sealed aperture adjacent the arm to which it is connected.

When the aforedescribed structure is coupled to an appropriate source of direct current obtained either from a battery, D.C. generator, or A.C. rectifier, the flow of current through the arms of the thermoelectric couples will produce a flow of heat in accordance with the Peltier effect. The hot junctions 17 are arranged adjacent wall 11 in heat exchange relationship therewith, but electrically insulated therefrom by means of insulation 14, while the cold junctions 18 are arranged in heat exchange relationship with wall 12, but insulated therefrom by means of insulation 14. The physical closeness of the junctions to the panel walls promotes thermal transfer therebetween.

It will be observed that the path by which heat may flow between walls 11 and 12 is relatively long as compared to the heat transfer path between the thermoelectric junctions and the panel wall. As a result losses due to heat transfer between the walls is negligible.

The vacuum serves to permit the external atmospheric pressure to force the walls of the panel against the thermoelectric elements serving to retain same in position and permitting the elements to provide structural support for the panel walls. In the event that it is desired to provide additional support for the thermoelectric elements, a non-conducting material such as Fiberglas as illustrated in FIGURE 3 may be provided within the envelope.

If it is desired to cut down radiative losses, such losses may be inhibited by the introduction of multiple layered reflective insulation such as metalized polyester films or by means of Fiberglas insulation.

It is thus seen that a novel thermoelectric heat pump has been embodied in a relatively light-weight thin panel which may readily be installed to effect heat pumping between the area separated by the panel.

The above disclosure has been given by way of illustration and elucidation, and not by way of limitation, and it is desired to protect all embodiments of the herein disclosed inventive concept within the scope of the appended claim.

I claim:

A thermoelectric panel assembly comprising a pair of substantially similar, dish shaped, thin, flexible heat conductive wall members; said wall members having their peripheral edges meeting at a seam and secured to each other by an air-tight joint; said wall members each further having a substantially flat portion thereon; the flat portions of said pair of wall members being substantially parallel to each other, and spaced from each other, and spaced equidistantly from said seam so as to form a hollow sealed envelope; a plurality of thermoelectric elements of dissimilar thermoelectric properties disposed within said sealed envelope transversely to the plane of said seam; said thermoelectric elements being electrically connected by junction members to form a thermoelectric circuit having dissimilar thermoelectric junctions spaced from each other and disposed adjacent the respective, spaced, parallel, flat portions of said flexible heat conductive wall members; conductor means electrically connected to said thermoelectric elements for the passage of a unidirectional current therethrough in a predetermined direction, said conductor means being sealed to and passing through said wall members; the interior of said sealed envelope being evacuated below ambient pressure so that ambient pressure forces each of said flat portions of said wall members inwardly and compresses each of said junction members against the ends of their associated thermoelectric elements; and a fibrous insulation material disposed substantially throughout said sealed envelope and surrounding said thermoelectric elements therein.

References Cited in the file of this patent

UNITED STATES PATENTS

| | | |
|---|---|---|
| 1,848,655 | Petrik | Mar. 8, 1932 |
| 2,844,638 | Lindenblad | July 22, 1958 |
| 2,848,793 | Pityo | Aug. 26, 1958 |
| 2,877,539 | Kinnan | Mar. 17, 1959 |
| 2,886,618 | Goldsmid | May 12, 1959 |

UNITED STATES PATENT OFFICE

CERTIFICATE OF CORRECTION

Patent No. 3,035,109 May 15, 1962

Addison C. Sheckler

It is hereby certified that error appears in the above numbered patent requiring correction and that the said Letters Patent should read as corrected below.

Column 1, line 45, for "hermoelectric" read -- thermoelectric --; line 46, for "coupled together into a battery or pile of thermoelectric" read -- couples with the hot junctions of said thermoelectric --.

Signed and sealed this 9th day of October 1962.

(SEAL)
Attest:

ERNEST W. SWIDER
Attesting Officer

DAVID L. LADD
Commissioner of Patents